(12) United States Patent
Kok et al.

(10) Patent No.: US 7,187,431 B2
(45) Date of Patent: Mar. 6, 2007

(54) LITHOGRAPHIC APPARATUS, METHOD OF DETERMINING PROPERTIES THEREOF AND COMPUTER PROGRAM

(75) Inventors: Haico Victor Kok, Eindhoven (NL); Johannes Jacobus Matheus Baselmans, Oirschot (NL)

(73) Assignee: ASML Netherlands B.V., Veldhoven (NL)

( * ) Notice: Subject to any disclaimer, the term of this patent is extended or adjusted under 35 U.S.C. 154(b) by 212 days.

(21) Appl. No.: 10/988,845

(22) Filed: Nov. 16, 2004

(65) Prior Publication Data

US 2006/0103826 A1 May 18, 2006

(51) Int. Cl.
*G03B 27/54* (2006.01)

(52) U.S. Cl. .............................. 355/67; 355/68; 355/69; 355/77

(58) Field of Classification Search ...................... None
See application file for complete search history.

(56) References Cited

U.S. PATENT DOCUMENTS

| 3,694,088 A * | 9/1972 | Gallagher et al. .......... 356/495 |
|---|---|---|
| 5,367,375 A | 11/1994 | Siebert ........................ 356/520 |
| 5,872,625 A | 2/1999 | Kajino et al. ................ 356/124 |
| 6,771,362 B2 | 8/2004 | Keren et al. ................. 356/124 |
| 6,859,264 B2 * | 2/2005 | Nakauchi et al. ............. 355/68 |
| 2002/0012124 A1 * | 1/2002 | Nakayama et al. ......... 356/489 |
| 2004/0263783 A1 | 12/2004 | Neal et al. ................... 351/221 |

* cited by examiner

*Primary Examiner*—D. Rutledge
(74) *Attorney, Agent, or Firm*—Pillsbury Winthrop Shaw Pittman LLP

(57) ABSTRACT

A system is disclosed that includes an interferometric sensor for measuring the wavefront of a radiation beam at, the interferometric sensor having a detector; an actuator for displacing the interferometric sensor in a direction along an optical axis; a first module for determining the change of phase of the wavefront at each of a plurality of locations on the detector, the change of phase resulting from displacement of the interferometric sensor by the actuator; and a second module for determining, for each of the plurality of locations, the corresponding pupil location at a pupil plane of the projection system traversed by the radiation, using the change of phase determined by the first module and the value of the displacement of the interferometric sensor, to produce a mapping between locations on the detector and corresponding pupil locations.

22 Claims, 4 Drawing Sheets

LITHOGRAPHIC APPARATUS, METHOD OF DETERMINING PROPERTIES THEREOF AND COMPUTER PROGRAM

FIELD

The present invention relates to a method of determining properties, such as the numerical aperture and telecentricity, of the projection lens in a lithographic apparatus

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a lithographic apparatus it is desirable to know characteristics of the projection lens used for imaging the pattern on the patterning device onto the substrate. Such characteristics may also be referred to as properties or parameters of the projection lens. One such property is the numerical aperture (NA) of the lens which affects the imaging of the lithographic apparatus. Knowledge of the exact value of the numerical aperture can be used in simulations to determine settings and process windows for the lithographic apparatus. In some apparatus, the projection lens has an adjustable numerical aperture which is defined by elements such as an adjustable diaphragm at a pupil plane in the projection lens system. Measurement of the actual numerical aperture setting is thus performed.

Previously, the numerical aperture has been measured by imaging defocused pinholes on to a resist-coated substrate. The defocusing is performed by placing the pinholes on top of a mask (or using a mask upside down, such that the opaque layer defining the pinholes is displaced from the usual plane of the patterning device. Diffractive features, such as gratings or arrays, are provided inside the pinholes so that the radiation fills the complete numerical aperture of the projection lens system. However, this technique has the problem that extensive measurement analysis of the resist is necessary, which is slow, and the result is not a simple direct measurement performed on the apparatus.

Another characteristic of a lithographic apparatus is the telecentricity of the projection lens and also of the illuminator which provides the radiation beam for the patterning device and projection lens. Non-telecentricity of the illuminator and projection lens can cause overlay problems. The non-telecentricity of the projection lens affects the imaging performance. Previously the telecentricity has been measured quantitatively by performing overlay measurements at different focus levels of the substrate. However, this method also suffers from the problems of being slow and cumbersome, and the method is not very sensitive to telecentricity of the projection lens.

SUMMARY OF THE INVENTION

It is desirable to have knowledge of the value of the numerical aperture of the projection lens system. It is also desirable to have information regarding the degree of non-telecentricity of the projection lens system and also of the illuminator.

According to one aspect of the present invention there is provided a lithographic apparatus arranged to project a patterned radiation beam from a patterning device onto a substrate using a projection system, and comprising:

an interferometric sensor for measuring the wavefront of the radiation beam at the level of the substrate, the interferometric sensor having a detector;

an actuator for displacing the interferometric sensor in a direction along the optical axis;

a first module for determining the change of phase of the wavefront at each of a plurality of locations on the detector of the interferometric sensor, the change of phase resulting from displacement of the interferometric sensor by the actuator between a first position and a second position; and a second module for determining, for each of the plurality of locations on the detector, the corresponding pupil location at the pupil plane of the projection system traversed by the radiation, using the change of phase determined by the first module and the value of the displacement of the interferometric sensor by the actuator, to produce a mapping between locations on the detector and corresponding pupil locations.

According to another aspect, the present invention provides a method for determining properties of a lithographic apparatus, the lithographic apparatus comprising: an illumination system configured to condition a radiation beam;

a support constructed to support a patterning device, the patterning device being capable of imparting the radiation beam with a pattern in its cross-section to form a patterned radiation beam;

a substrate table constructed to hold a substrate;

a projection system configured to project the patterned radiation beam onto a target portion of the substrate; and an interferometric sensor for measuring the wavefront of the radiation beam at the level of the substrate, wherein the method comprises:

determining the change of phase of the wavefront at each of a plurality of locations on the detector of the interferometric sensor, the change of phase resulting from displacement of the interferometric sensor along the optical axis by an actuator between a first position and a second position; and calculating, for each of the plurality of locations on the detector, the corresponding pupil location at the pupil plane of the projection system traversed by the radiation, using the determined change of phase and the value of the displacement of the interferometric sensor by the actuator, to produce a mapping between locations on the detector and corresponding pupil locations.

A further aspect of the invention provides a computer program comprising computer-executable code that when executed on a computer system instructs the computer system to control a lithographic apparatus to perform a method as defined above.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
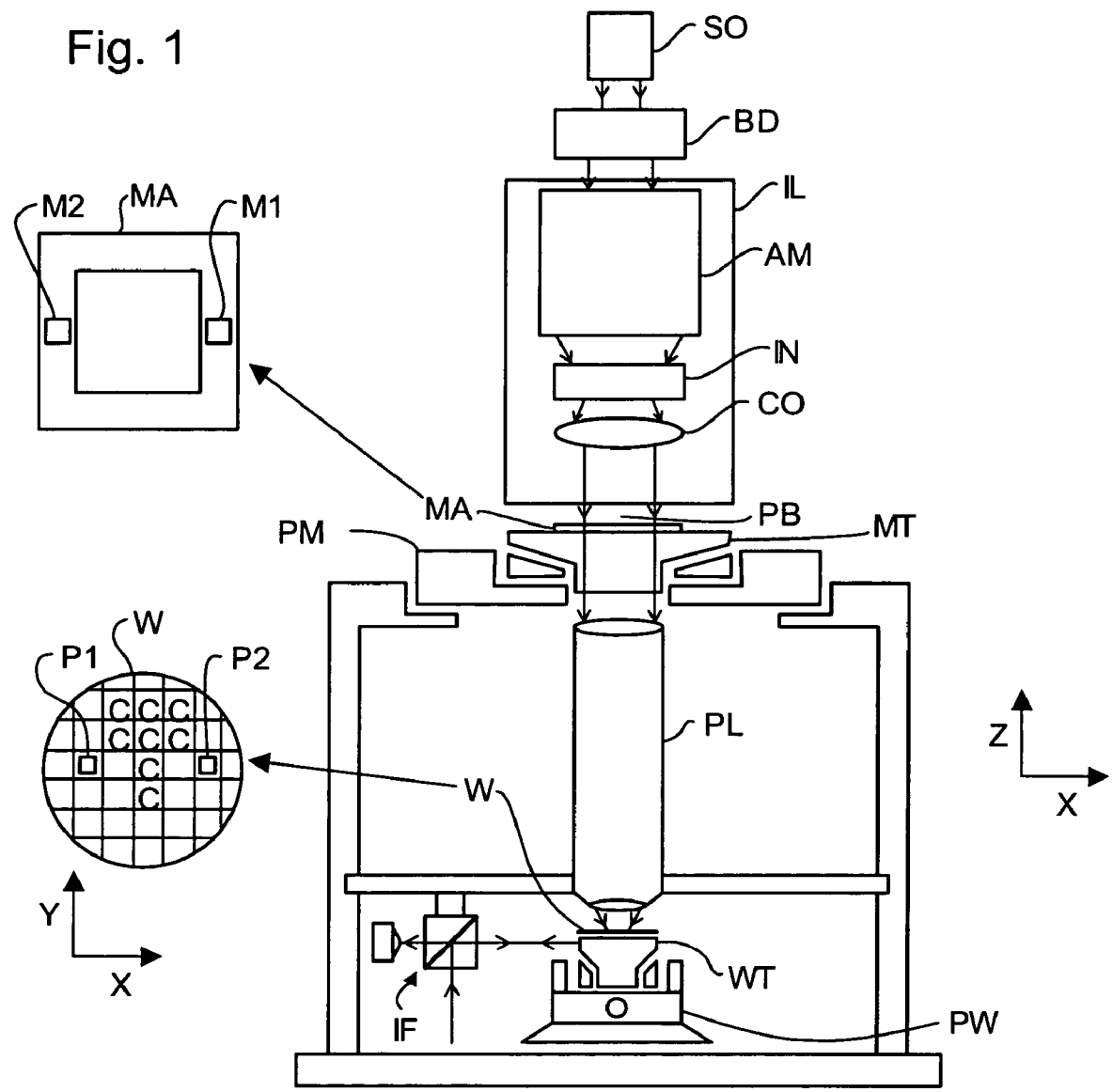
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam PB (e.g. UV radiation or EUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Previously there has been proposed a measurement system for measuring wave front aberrations of a projection lens using the principal known as a "shearing interferometer". According to this proposal, different portions of the projection beam from a particular location at the level of the patterning device travel along different paths through the projection lens. This can be achieved by a diffractive element located in the projection beam between the illumination system and the projection system. The diffractive element, such as a grating, also known as the object grating, diffracts the radiation and spreads it out such that it passes through the projection system along a plurality of different paths. The diffractive element is typically located at the level at which the patterning device, e.g. mask MA is located. The diffractive element can be a grating or can be an array of features of suitable size, and may be provided within a pinhole. One or more lenses may also be associated with the diffractive element. This assembly as a whole, located in the projection beam between the illuminator and the projection system will be referred to hereafter as the source module.

Figure 2:
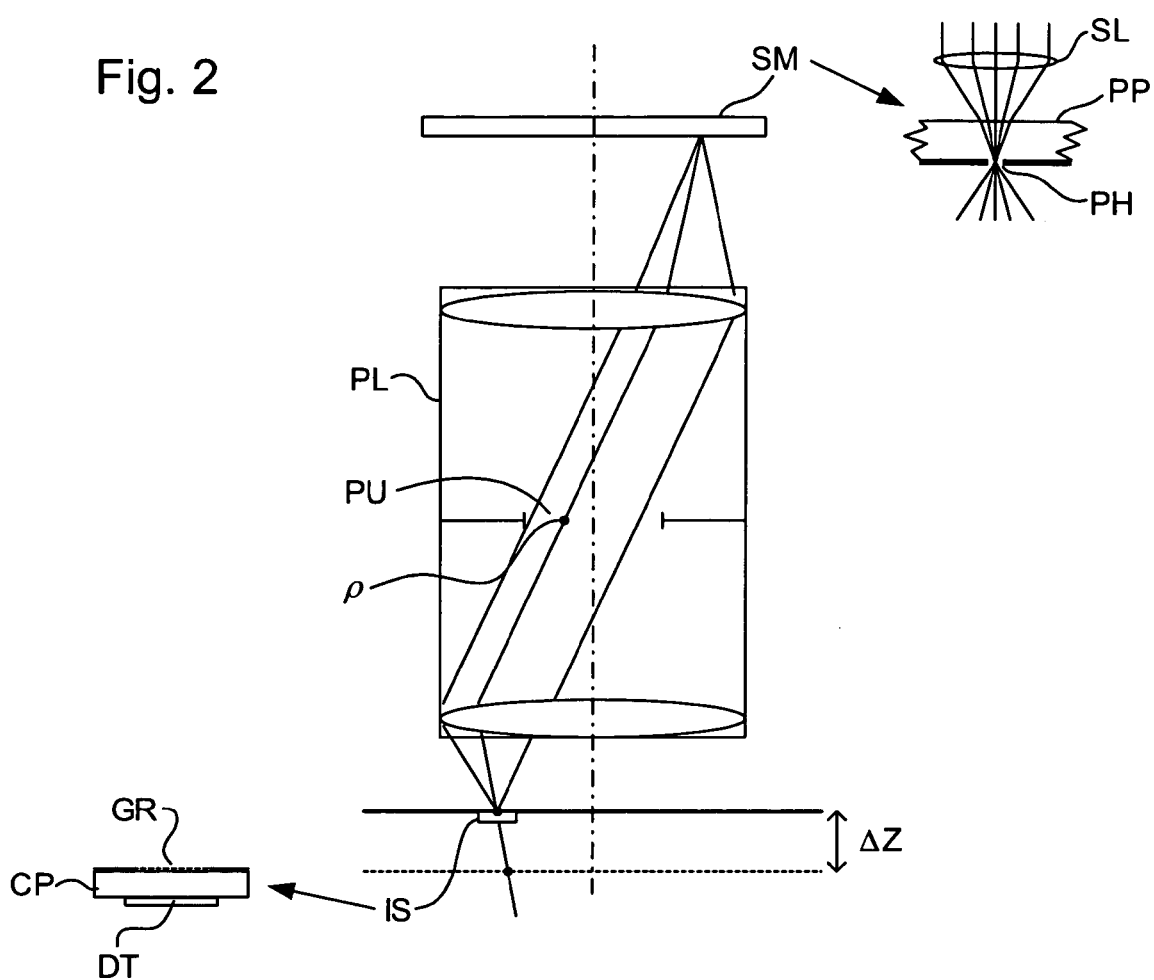
FIG. 2 shows a schematic cross-section of the projection lens system during implementation of a method embodying the invention.

Referring to FIG. 2, a source module SM for use with an embodiment of the present invention is illustrated. It comprises a pinhole plate PP which is a quartz glass plate with an opaque chromium layer on one side, same as a reticle, and with a pinhole PH provided in the chromium layer. It also comprises a lens SL for focusing the projection radiation on to the pinhole. In practice an array of pinholes and lenses for different field positions and different slit positions are provided, and the lenses can be integrated on top of the pinhole plate. The source module should ideally generate light within a wide range of angles such that the pupil of the projection lens is filled, or indeed overfilled, for numerical aperture measurements, and preferably the pupil filling should be uniform. The use of the lens SL can achieve the over-filling and also increases the light intensity. The pinhole PH limits the light to a specific location within the field. Alternative ways to obtain uniform pupil filling are to use a diffusor plate (such as an etched ground glass plate) on top of the pinhole plate, or an array of microlenses (similar to a diffractive optical element DOE), or a holographic diffusor (similar to a phase-shift mask PSM). The pinhole may have some structuring within, such as sub-resolution diffractive features e.g. grating patterns, checkerboard patterns, but this is optional, and preferably there is no structuring for embodiments of the invention. Thus specific source module SM embodiments include; as illustrated in FIG. 2; as illustrated but without the focusing lens and with a diffusor on top; and a pinhole mask with sub-resolution features inside.

Radiation that has traversed the projection system then impinges on a further diffractive element GR, such as a pinhole or a grating, known as the image grating. Referring to FIG. 2, the further diffractive element GR is mounted on a carrier plate CP, for example made of quartz. This further diffractive element acts as the "shearing mechanism" that generates different diffractive orders which can be made to interfere with each other. For example, the zero order may be made to interfere with the first order. This interference results in a pattern, which can be detected by a detector to reveal information on the wave front aberration at a particular location in the image field. The detector DT can be, for example, a CCD or CMOS camera which captures the image of the pattern electronically without using a resist. The further diffractive element GR and the detector DT will be referred to as the interferometric sensor IS. Conventionally, the further diffractive element GR is located at the level of the substrate at the plane of best focus, such that it is at a conjugate plane with respect to the first-mentioned diffractive element in the source module SM. The detector DT is below the further diffractive element GR and spaced apart from it.

One proprietary form of an interferometric wave front measurement system implemented on lithography tools is know as ILIAS (trademark) which is an acronym for Integrated Lens Interferometer At Scanner. This measurement system is routinely provided on lithographic projection apparatus.

Figure 3:
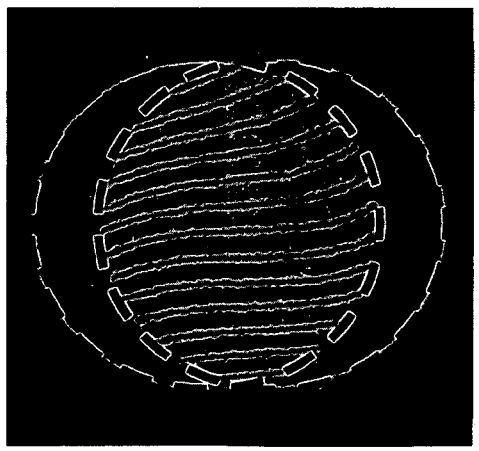
FIG. 3 shows two schematic examples of interference patterns between wavefronts sheared in orthogonal directions.
Figure 3:
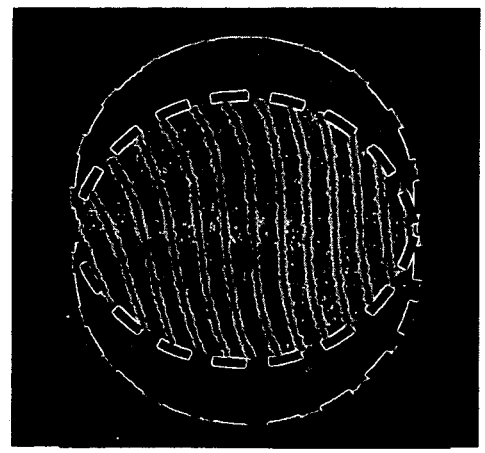

The interferometric sensor essentially measures the derivative phase of the wave front. The detector itself can only measure light intensity, but by using interference the phase can be converted to intensity. Most interferometers require a secondary reference beam to create an interference pattern, but this would be hard to implement in a lithographic projection apparatus. However a class of interferometer which does not have this requirement is the shearing interferometer. In the case of lateral shearing, interference occurs between the wavefront and a laterally displaced (sheared) copy of the original wavefront. In the present embodiment, the further diffractive element GR splits the wavefront into multiple wavefronts which are slightly displaced (sheared) with respect to each other. Interference is observed between them. In the present case only the zero and +/− first diffraction orders are considered. The intensity of the interference pattern relates to the phase difference between the zero and first diffraction orders. It can be shown that the intensity I is given by the following approximate relation:

$$I \approx 4E_0 E_1 \cos\left(2\pi i \left[\frac{k}{p} + \frac{1}{2}\left(W\left(\rho + \frac{1}{p}\right) - W\left(\rho - \frac{1}{p}\right)\right)\right]\right)$$

where $E_0$ and $E_1$ are the diffraction efficiencies for the zero and first diffracted orders, k is the phase stepping distance, p is the grating periodicity (in units of waves), W is the wavefront aberration (in units of waves) and $\rho$ is the pupil location. In the case of small shearing distances, the wavefront phase difference approximates the wavefront derivative. By performing successive intensity measurements, with a slight displacement of the source module SM with respect to the interferometric sensor IS, the detected radiation intensity is modulated (the phase stepping factor k/p in the above equation is varied). The first harmonics (with the period of the grating as the fundamental frequency) of the modulated signal correspond to the diffraction orders of interest (0 & +/−1). The phase distribution (as a function of pupil location) corresponds to the wavefront difference of interest. By shearing in two substantially perpendicular directions, the wavefront difference in two directions is considered. FIG. 3 gives two examples of interference patterns between wavefronts sheared in orthogonal directions. The detector effectively sees an image of the pupil plane of the projection lens; the image of the pupil is indicated by the dashed circles in FIG. 3.

However, there is the problem of how to relate a particular pixel of the detector to a particular coordinate at the pupil plane. Factors which affect this include: the 6 degrees of freedom in the relative position of the detector DT with respect to the grating GR (translations along three axes x, y, z, and rotations about 3 axes Rx, Ry and Rz); the thickness of the carrier plate CP; the degree of unflatness of the detector DT; and the wedge angle and unflatness of the carrier plate CP. It is difficult to achieve precise mechanical specifications in the tolerance and alignment of these components.

Figure 4:
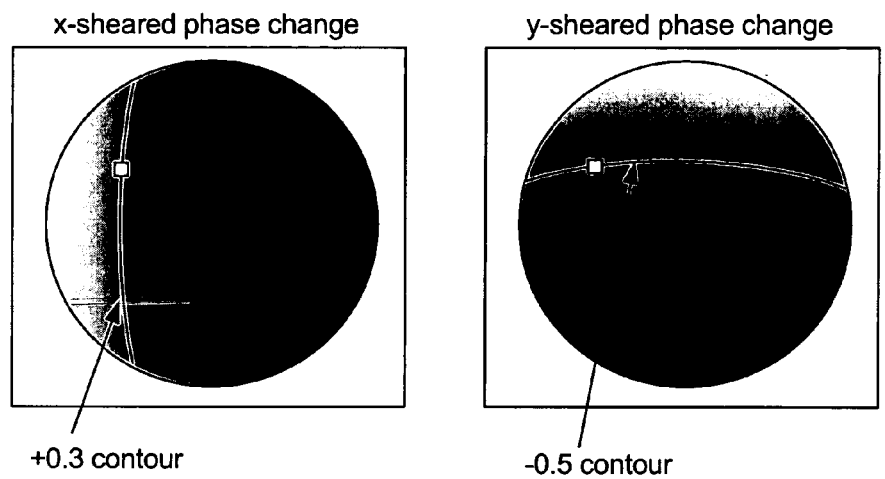
FIG. 4 shows plots of phase change as a result of defocus across the image of the pupil for x-shearing and y-shearing.

One solution to this problem is to apply a calibration step. The pupil coordinate corresponding to each detector pixel is calibrated by measuring sheared wavefronts at two different focus positions. The different focus positions are separated by a displacement of the interferometric sensor by an amount )Z, as shown in FIG. 2. One of the positions could be the plane of best focus, and the other position defocused by )Z, but it is not essential that one of the positions be the plane of best focus. The shift )Z introduces a known amount of aberration, and leads to a unique phase change for each pupil position. This is illustrated schematically in FIG. 4 which shows plots of phase change as a result of defocus )Z across the image of the pupil for x-shearing and y-shearing. A contour of points with phase change of +0.3 for x and a contour of points with phase change of −0.5 for y are shown. The intersection of these contours identifies a pixel with this unique phase change. When the interferometric sensor is moved along the optical axis, i.e. in the Z direction in FIGS. 1 and 2, then the derivative phase will change. The exact amount of phase change depends on the displacement )Z, and the point in the pupil PU at location $\rho$ traversed by the radiation from source module SM, as illustrated in FIG. 2. Therefore for a known displacement or defocus )Z and a measured change in phase at a particular point on the detector, it is possible to determine the pupil point $\rho$ traversed by the radiation.

In more detail, sheared wavefronts upon defocus are given by:

$$WX_{k,l} = \Delta Z(\sqrt{1-(u+s)^2-v^2} - \sqrt{1-(u-s)^2-v^2})$$

$$WY_{k,l} = \Delta Z(\sqrt{1-u^2-(v+s)^2} - \sqrt{1-u^2-(v-s)^2})$$

where WX and WY are the wavefronts sheared in the x and y directions respectively, measured upon defocus )Z, at a given pixel position k,l as a function of the pupil coordinates u.v and with a shear distance s. In these expressions the pupil coordinates u,v relate to the sine of the angles within the two perpendicular shearing directions, u=sin(theta) and v=sin (phi), where theta and phi are angles with respect to the Z-axis and orthogonal with respect to each other, usually in the x and y directions. (These coordinates could be normalised to be 1 at the edge of the pupil by dividing by the numerical aperture NA of the projection lens, i.e. to give pupil position coordinates $\rho$). The pair of equations above comprise two known quantities ( )Z and s), two measurements (WX and WY), and two unknowns (u, v). For each detector pixel one can invert the above pair of relations to obtain expressions for the pupil coordinates of that pixel in terms of the other quantities. The calculation can be done either analytically or numerically for each Δdetector pixel. Each pixel is given a pupil coordinate independent of the other pixels, and thus a mapping between pixels and pupil coordinates is produced.

This procedure does not assume anything about the alignment of the detector and grating, nor about the properties of the carrier plate, so these potential errors are effectively calibrated out. The accuracy is limited only by the accuracy of the measurement data for the sheared wavefronts and the parameters )Z and s. Multiple measurement and interpolation can increase the accuracy of the measurement data, if necessary; )Z is known with high accuracy from the positioning ability of the substrate table; and s is obtained externally, either by measurement or calibration.

Figure 5:
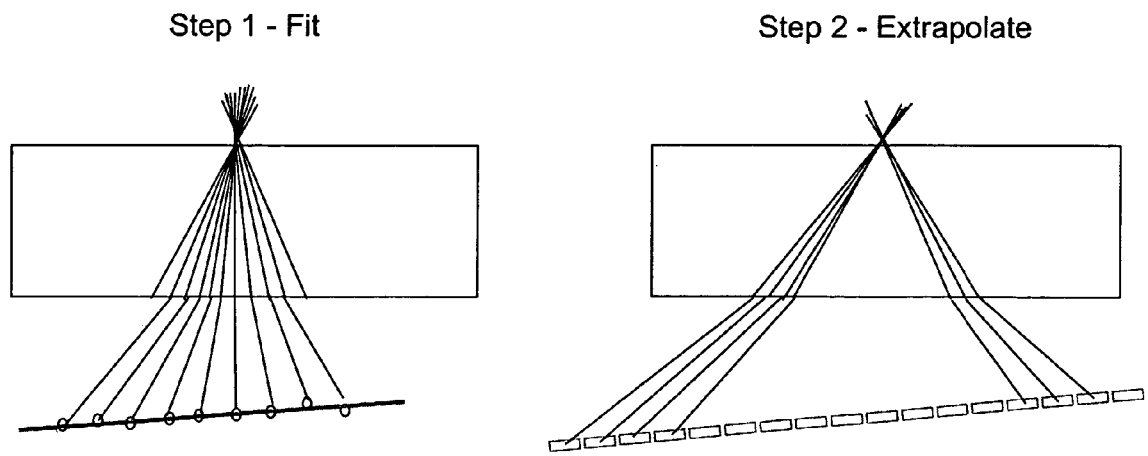
FIG. 5 schematically illustrates the procedure for extending the mapping between detector pixels and points at the pupil for regions which do not receive all three of the zero order and +/– first order diffracted beams.

This procedure returns pupil coordinates for all pixels inside the area that receives radiation from 3 beams (the zero and +/− first diffracted orders), which accounts for approximately 90% of all pixels within the pupil. Extrapolation is then used to extend the pupil mapping to the remaining part of the pupil image. This is done by a first step of assuming the detector to be flat such that each pixel of the detector (at position k, l) simply maps to a corresponding point in the pupil plane $(\rho_x, \rho_y)$ $$\rho_x = \Im_x(k,l,\text{DT6dof})$$

$$\rho_y = \Im_y(k,l,\text{DT6dof})$$

where DT6dof represents the six degrees of freedom (3 translation and 3 rotation) of the position of the plane of the detector with respect to the plane of the grating. Then fitting, using a least squares criterion, is performed to minimise the following function:

$$\sum_i (\rho_x^{measured} - \Im_x(k_i, l_i, DT6dof))^2 + \sum_i (\rho_y^{measured} - \Im_y(k_i, l_i, DT6dof))^2$$

where the index i ranges over all pixels in the 3 beam interference region, to obtain the six parameters DT6dof. Then, as a second step, for all other pixels, the same function is used to map the pixels to the pupil plane using the obtained values DT6dof. This process is illustrated by a ray-tracing analogy in FIG. 5.

Once the above calibration has been performed, the pupil can be measured, either at the same time as the calibration or as a separate exercise. Therefore according to the method of this embodiment of the invention, an image of the pupil is taken by the detector, which produces an intensity map, and the edge of the illuminated area is determined using standard image analysis algorithms. The detector coordinates for the radiation rays at the edge of the illuminated area are determined, and are converted to pupil coordinates using the calibration mapping; thus the boundary of the pupil PU is obtained. The pupil location at the edge of the pupil of the projection lens corresponds to an extreme ray path through the projection lens. For radiation with an angular distribution entering and exiting the projection lens PL, the angular distribution corresponds to the spatial distribution at the pupil PU. Therefore from the extremities of the pupil PU, one can obtain the angle of the most divergent rays that can pass through the projection lens. The angular aperture is defined as the angle between the most divergent rays which can pass through the lens system to form an image, and the numerical aperture (NA) is the sine of half the angular aperture. Thus from the measurement of the pupil extremities, the numerical aperture can be obtained; in fact, where the pupil coordinates are in terms of the sine of the angle with respect to the Z-axis, as above, then the numerical aperture NA is obtained directly from the coordinate at the edge of the pupil. One specific method is to fit a circular contour around the extreme edge of the illuminated area, i.e. corresponding to the marginal rays passing through the pupil, and the numerical aperture is given by the radius of that circle measured in units of the pupil coordinates.

This method provides for fast and accurate measurement of the numerical aperture of the projection lens PL using an existing interferometric sensor.

A further embodiment of the invention will now be described.

Figure 6A:
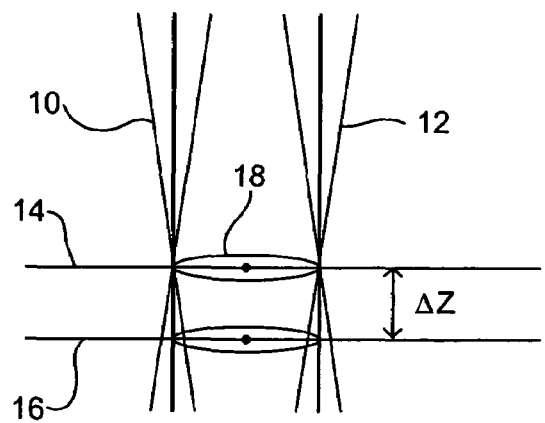
FIGS. 6(a) and (b) illustrate schematically the effect of defocus on telecentric and non-telecentric systems, respectively.
Figure 6B:
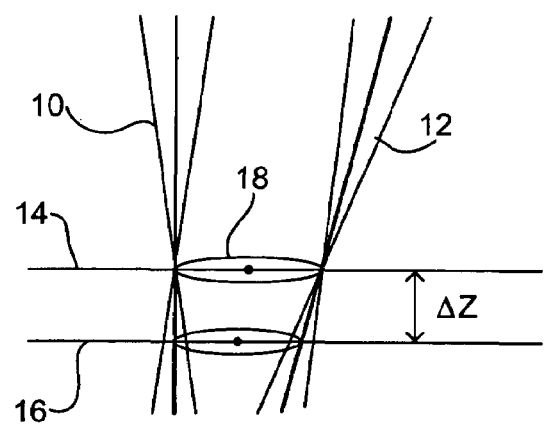

Telecentricity is a property of a lens system in which the principal rays for all points across the object or image are parallel. For the case of image space telecentricity this means that displacement of the image plane through focus does not change the image size or shift image features laterally. This is illustrated in FIG. 6(a) which shows two cones of rays 10, 12 at the edges of a feature 18 being imaged which are focused at plane 14. If the image plane is displaced by a distance )Z to a new plane 16, there is no change in magnification of the feature 18 being imaged (although, as it is defocused, there is a blurring effect). In contrast, as shown in FIG. 6(b), which is not telecentric, although the image formed at the plane of best focus 14 is substantially identical to that in FIG. 6(a), when the image plane is displaced by )Z, there is a change in magnification of the feature being imaged 18, and a lateral displacement of the centre of the feature indicated by the black dot. This description is of the field distribution of the telecentricity. Telecentricity is however a property of each individual field point. At a given field point, the radiation rays have a certain pointing (i.e. net propagation direction, normal to the wavefront at that point) defined with respect to some reference direction, usually the Z-axis of the apparatus.

Clearly telecentricity is a desirable feature for a lithographic apparatus, where the tolerances on feature size and positions are routinely below a tenth of a micron. Ideally, a projection lens for a lithographic apparatus is doubly telecentric, i.e. telecentric with respect to both the object (patterning device) and with respect to the image at the substrate. However, despite the great care with which the projection lens is made, there can still be some degree of non-telecentricity, so it is desirable to be able to quantify this.

The detector has been calibrated, as explained for the previous embodiment, into pupil coordinates. The origin of this coordinate system, i.e. the center with coordinates (0,0), corresponds to rays that are parallel to the Z-axis at the plane of the substrate. In the calibration procedure, the interferometric sensor is moved (defocused), which changes the derivative phase, except for the ray that is parallel to the direction of movement of the interferometric sensor, i.e. parallel to the Z-axis (optical axis). As there is no phase change at this point, the intensity at this point on the detector does not change. The location of this point on the detector can therefore be determined and is referred to as C.

Figure 7:
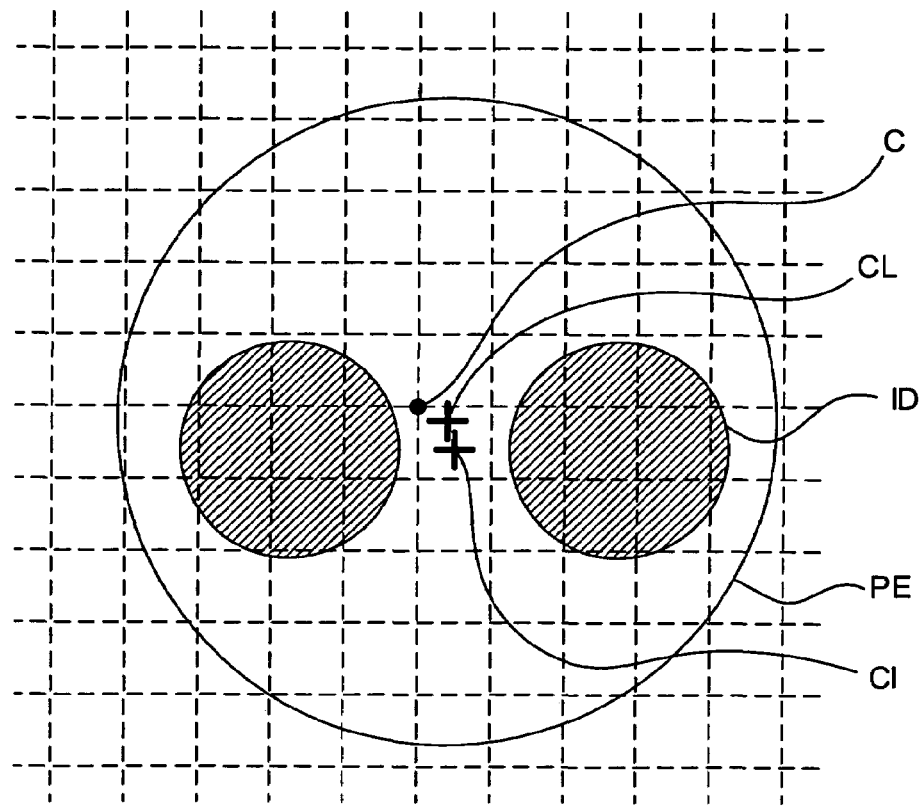
FIG. 7 depicts schematically the coordinate system obtained from the calibration procedure together with the full pupil of the projection system and the image of the intensity distribution from the illumination system, i.e. the illumination mode.

According to the present embodiment, an image of the pupil is captured, in fact the same image as for the numerical aperture measurement can be used, and the image of the pupil forms a substantially circular illuminated area on the detector of the interferometric sensor. FIG. 7 shows schematically this illuminated area bounded by the pupil edge PE relative to the coordinate system (grid of dashed lines) defined by the calibration procedure. In practice the image is an intensity map, and using standard image analysis algorithms the contours of equal intensity can be found and used to determine the position of the center CL of this area. The coordinates of the center CL (in terms of the calibrated pupil coordinate system, i.e. from C to CL) equal the telecentricity of the projection lens.

According to a further embodiment of the invention, rather than using the normal source module for the interferometric measurement system, which produces substantially uniform filling of the pupil by use of a diffusor or lens, instead a simple pinhole plate with pinhole on its own is used at the plane of the patterning device e.g. mask MA. In this case, the exit pupil of the illuminator forms a circular region on the detector of the interferometric sensor. Within the circular region the illumination will form the pattern of the intensity distribution for the particular illumination mode set in the illuminator. In the example illustrated schematically in FIG. 7, the intensity distribution ID is in the form of two diametrically opposite illuminated regions, i.e. a dipole illumination mode; this is merely an example and the intensity distribution would depend on whatever illumination mode is set by the illuminator. Using standard image analysis algorithms, the position of the center of gravity CI of the illumination rays is determined. The coordinates of the center CI (in terms of the calibrated pupil coordinate system, i.e. from C to CI) equal the telecentricity of the illuminator.

Thus according to these methods, fast and accurate measurement of the telecentricity (or rather non-telecentricity) of the projection lens and illuminator can be made using an existing interferometric sensor provided in the apparatus. As an additional advantage, no wafers need be exposed and it is not necessary to provide an offline tool for performing overlay measurements.

The above embodiments of the invention describe measuring the numerical aperture and telecentricity at a particular field point (i.e. a point selected by the source module at the plane of the patterning device e.g. mask), however the numerical aperture and telecentricity can vary from field point to field point. Therefore a further embodiment is to measure this variation. This is done by using any of the above methods and either moving the source module and sensor to repeatedly take measurements at different field points, and/or providing multiple sources and sensors such that measurements at multiple field points can be taken in parallel.

The results of the measurements according to any of the above embodiments of the invention can be used to provide feedback. For example, in an apparatus in which the numerical aperture is adjustable, for example by selecting a setting of a diaphragm, the actual numerical aperture can be measured at a plurality of different settings and then a calibrated look-up table produced to give the actual numerical aperture that you get for a given nominal numerical aperture that is set according to the machine. Furthermore, numerical aperture variation over the field can be compensated by other imaging parameters, for example by dose variation across the field. The lens design can also be modified. The telecentricity measurement can be used to adjust the illuminator with respect to the projection lens, either on-line or off-line, for example to improve the telecentricity (i.e. reduce the non-telecentricity). Similarly, the calibrated sensor can measure the actual illumination at the pupil and can be used to tune a look-up table for illumination modes, for example relating sigma settings to the sigma values that one actually gets. Measurements of the illumination at the pupil can also be used as a basis for adjusting other illuminator parameters, such as pole balance and ellipticity.

The present invention is also embodied in a lithographic apparatus capable of performing the methods described above. The apparatus comprises an actuator for displacing the interferometric sensor IS, and a number of modules for performing the measurements, analysis and calculations to obtain the values of numerical aperture and/or telecentricity as output. The modules can be embodied in hardware or as software running on a computer, either dedicated or general purpose. Further actuators can be provided for adjusting components of the lithographic apparatus by way of feedback based on the obtained measurements.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5–20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A system to determine an optical characteristic of a lithographic apparatus having a projection system, comprising:
   an interferometric sensor configured to measure a wavefront of a radiation beam at a level of a substrate, the interferometric sensor including a detector;
   an actuator configured to displace the interferometric sensor in a direction along an optical axis of the projection system;
   a first optical module configured to determine a change of phase of the wavefront at each of a plurality of locations on the detector of the interferometric sensor, the change of phase resulting from displacement of the interferometric sensor by the actuator between a first position and a second position; and
   a second module configured to determine, for each of the plurality of locations on the detector, a corresponding pupil location at a pupil plane of the projection system traversed by the radiation beam, using the change of phase determined by the first module and a value of the displacement of the interferometric sensor by the actuator, to produce a mapping between locations on the detector and corresponding pupil locations.

2. A system according to claim 1, wherein the second module is configured to use extrapolation to extend the mapping to locations in the pupil plane for which change of phase information is not available from the interferometric sensor and first module.

3. A system according claim 1, further comprising a source module configured to condition the radiation beam to overfill the pupil of the projection system to produce an illuminated area on the detector corresponding to an extent of the pupil of the projection system, wherein the second module is arranged to determine a point on the detector which is at an edge of the resulting illuminated area and to relate that point to a point at the pupil using the mapping and thereby derive a value for the numerical aperture of the projection system.

4. A system according to claim 1, wherein the first module is arranged to determine a point on the detector of the interferometric sensor at which the phase of the radiation beam does not change when the interferometric sensor is displaced by said actuator.

5. A system according to claim 1, further comprising a source module configured to condition the radiation bean to overfill the pupil of the projection system to produce an illuminated area on the detector corresponding to an extent of the pupil of the projection system, wherein the second module is arranged to determine a center of the resulting illuminated area and to use coordinates of the center to evaluate telecentricity of the projection system.

6. A system according to claim 1, further comprising an illumination system configured to produce a defined intensity distribution of the radiation beam prior to entry to the projection system, wherein an illumination pattern is produced, during use, on the detector corresponding to the defined intensity distribution, and wherein the second module is arranged to determine the center of the resulting illumination pattern and to use coordinates of the center to evaluate telecentricity of the illumination system.

7. A system according to claim 5, wherein the coordinates are defined in terms of the mapping to the pupil, with the origin of the coordinate system being the point corresponding to a point on the detector of the interferometric sensor at which the phase of the radiation beam does not change when the interferometric sensor is displaced by said actuator.

8. A method for determining a property of a lithographic apparatus comprising:
   determining a change of phase of a wavefront of radiation at each of a plurality of locations on a detector of an interferometric sensor at a substrate level, the change of phase resulting from displacement of the interferometric sensor along an optical axis between a first position and a second position; and
   calculating, for each of the plurality of locations on the detector, a corresponding pupil location at a pupil plane of a projection system of the lithographic apparatus traversed by the radiation, using the determined change of phase and a value of the displacement of the interferometric sensor, to produce a mapping between locations on the detector and corresponding pupil locations.

9. A method according to claim 8, wherein the calculating further comprises using extrapolation to extend the mapping to locations in the pupil plane for which change of phase information is not measured in the determining.

10. A method according claim 8, further comprising:
    conditioning the radiation to overfill the pupil of the projection system to produce an illuminated area on the detector corresponding to an extent of the pupil of the projection system, wherein the calculating further includes determining a point on the detector which is at an edge of the resulting illuminated area and relating that point to a point at the pupil using the mapping and thereby deriving a value for the numerical aperture of the projection system.

11. A method according to claim 8, further comprising determining a point on the detector of the interferometric sensor at which the phase of the radiation does not change when the interferometric sensor is displaced.

12. A method according to claim 8, further comprising conditioning the radiation to overfill the pupil of the projection system to produce an illuminated area on the detector corresponding to an extent of the pupil of the projection system, determining the center of the resulting illuminated area and using coordinates of the center to evaluate telecentricity of the projection system.

13. A method according to claim 8, further comprising:
    producing a defined intensity distribution of radiation prior to entry to the projection system;
    producing an illumination pattern on the detector corresponding to the defined intensity distribution;
    determining the center of the resulting illumination pattern; and
    using coordinates of the center to evaluate telecentricity of an illumination system used to produec the defined intensity distribution.

14. A method according to claim 12, wherein the coordinates are defined in terms of the mapping to the pupil, with the origin of the coordinate system being a point on the detector of the interferometric sensor at which the phase of the radiation does not change when the interferometric sensor is displaced.

15. A machine readable medium including machine executable instructions for performing a method for operating a lithographic projection apparatus, the method comprising:
    determining a change of phase of a wavefront of radiation at each of a plurality of locations on a detector of an interferometric sensor at a substrate level, the change of phase resulting from displacement of the interferometric sensor along an optical axis between a first position and a second position; and calculating, for each of the plurality of locations on the detector, a corresponding pupil location at a pupil plane of a projection system of the lithographic apparatus traversed by the radiation, using the determined change of phase and a value of the displacement of the interferometric sensor, to produce a mapping between locations on the detector and corresponding pupil locations.

16. A lithographic apparatus comprising:

an illumination system configured to condition a radiation beam;

a support constructed to support a patterning device, the patterning device being capable of imparting the radiation beam with a pattern in its cross-section to form a patterned radiation beam;

a substrate table constructed to hold a substrate;

a projection system configured to project the patterned radiation beam onto a target portion of the substrate;

an interferometric sensor for measuring a wavefront of the radiation beam at a level of the substrate, the interferometric sensor including a detector;

an actuator for displacing the interferometric sensor in a direction along an optical axis;

a first module for determining a change of phase of the wavefront at each of a plurality of locations on the detector of the interferometric sensor, the change of phase resulting from displacement of the interferometric sensor by the actuator between a first position and a second position; and a second module for determining, for each of the plurality of locations on the detector, a corresponding pupil location at a pupil plane of the projection system traversed by the radiation, using the change of phase determined by the first module and a value of the displacement of the interferometric sensor by the actuator, to produce a mapping between locations on the detector and corresponding pupil locations.

17. A machine readable medium according to claim 15, wherein the calculating further comprises using extrapolation to extend the mapping to locations in the pupil plane for which change of phase information is not measured in the determining.

18. A machine readable medium according claim 15, wherein the calculating further includes determining a point on the detector which is at an edge of an illuminated area on the detector corresponding to an extent of the pupil of the projection system that has been overfilled and relating that point to a point at the pupil using the mapping and thereby deriving a value for the numerical aperture of the projection system.

19. A machine readable medium according to claim 15, wherein the method further comprises determining a point on the detector of the interferometric sensor at which the phase of the radiation does not change when the interferometric sensor is displaced.

20. A machine readable medium according to claim 15, wherein the method further comprises determining the center of an illuminated area on the detector corresponding to an extent of the pupil of the projection system that has been overfilled and using coordinates of the center to evaluate telecentricity of the projection system.

21. A machine readable medium according to claim 15, wherein the method further comprises:

determining the center of an illumination pattern on the detector corresponding to a defined intensity distribution of radiation prior to entry to the projection system; and using coordinates of the center to evaluate telecentricity of an illumination system used to produce the defined intensity distribution.

22. A machine readable medium according to claim 21, wherein the coordinates are defined in terms of the mapping to the pupil, with the origin of the coordinate system being a point on the detector of the interferometric sensor at which the phase of the radiation does not change when the interferometric sensor is displaced.

* * * * *